United States Patent [19]
Kim et al.

[11] Patent Number: 5,304,828
[45] Date of Patent: Apr. 19, 1994

[54] SILICON LAYER HAVING INCREASED SURFACE AREA AND METHOD FOR MANUFACTURING

[75] Inventors: Jae K. Kim; In S. Chung, both of Kyungki, Rep. of Korea

[73] Assignee: Hyundai Electronics Industries Co., Ltd., Kyungki, Rep. of Korea

[21] Appl. No.: 899,332

[22] Filed: Jun. 16, 1992

Related U.S. Application Data

[62] Division of Ser. No. 716,901, Jun. 18, 1991, Pat. No. 5,149,676.

[30] Foreign Application Priority Data

Jun. 22, 1990 [KR] Rep. of Korea ............... 90-9260

[51] Int. Cl.$^5$ ............... H01L 29/68; H01L 27/02; H01L 29/06; H01L 27/12
[52] U.S. Cl. ............... 257/309; 257/534; 257/622; 257/49
[58] Field of Search ............... 357/23.6, 51, 55, 4; 257/309, 534, 622, 49; 437/52, 225

[56] References Cited

U.S. PATENT DOCUMENTS

| | | | |
|---|---|---|---|
| 5,043,780 | 8/1991 | Fazan et al. | 257/534 |
| 5,084,405 | 1/1992 | Fazan et al. | 357/23.6 |
| 5,136,533 | 8/1992 | Harari | 257/309 |

FOREIGN PATENT DOCUMENTS 2068286 8/1981 United Kingdom .

OTHER PUBLICATIONS

Japanese Journal of Applied Physics, vol. 16, #1, pp. 175-176 by Matsuo et al. Jan. 1977.
Applied Physics Letters, vol. 35 #10, pp. 742-744 by Gittleman et al. Nov. 1979.
Applied Physics Letters, vol. 37 #7, pp. 653-655 by Craighead et al. Oct. 1980.

Primary Examiner—Mark V. Prenty
Attorney, Agent, or Firm—Merchant, Gould, Smith, Edell, Welter & Schmidt

[57] ABSTRACT

A silicon layer having an increased surface area by providing a highly granulated surface area, and a method for manufacturing the same are disclosed. The highly granulated surface of the silicon layer of the present invention provides greater surface area relative to the surface area of the present silicon layer where both layers have the same (length and width) dimensions. The present invention provides a silicon layer for a charge storage electrode having an increased surface area by forming the surface of the silicon layer into a highly granulated topography, which is used as a charge storage electrode, to enable the capacitance of the stacked capacitor to be increased relative to a prior art stacked capacitor having the same area of the silicon layer but with less granulated topography, and provides a process of making a highly granulated silicon layer having an increased surface area relative to the existing methods of making a silicon layer and its associated surface area.

3 Claims, 4 Drawing Sheets

SILICON LAYER HAVING INCREASED SURFACE AREA AND METHOD FOR MANUFACTURING

This is a division of application Ser. No. 07/716,901 filed Jun. 18, 1991 and now U.S. Pat. No. 5,149,676.

BACKGROUND OF THE INVENTION

1. Field of the Invention

The invention relates to a silicon layer for a semiconductor device having an increased surface area and to a method for manufacturing the same, and more particularly, to a silicon layer having an increased surface area by providing a highly granulated surface area, and a method for manufacturing the same. The highly granulated surface of the silicon layer of the present invention provides greater surface area relative to the surface area of the present silicon layer where both layers have the same (length and width) dimensions.

2. Information Disclosure Statement

In general, as the unit area of the semiconductor device decreases, the integrity thereof increases. This has necessitated an improvement in the stacked capacitor of the semiconductor device to enhance the capacity for storing information. However, upon further increasing the integrity of the semiconductor device, there is still room for improvement in the capacity of the stacked capacitor. To this end, a stacked capacitor has been developed which is constructed with multiple layers to increase the capacitance of the capacitor.

However, with the use of the multiple layered stacked capacitor, the profile of the resulting semiconductor device is usually less than desirable, i.e. slopped. That is when the multi-layered stacked capacitor is used it is difficult to perform a desired contact mask pattern process in the contact region stacked semiconductor device. Furthermore, when depositing a conducting layer on the contact region, an excessively large difference between the resulting conducting layer and the contact region cannot be avoided.

None of the present processes are directed to increasing the effective surface area to yield the advantages disclosed herein. That is, the present processes for forming a silicon layer merely deposit such a layer where needed without any of the subsequent process steps being directed to increasing the effective surface area.

Therefore, it is an object of the present invention to solve the problems set forth above and provide a silicon layer having an increased surface area by forming the surface of the silicon layer into a highly granulated topography, which may be used as a charge storage electrode in a stacked capacitor to enable the capacitance of the stacked capacitor to be increased relative to a prior art stacked capacitor having the same area of the silicon layer but with less granulated topography, and to provide a method for manufacturing the same.

It is a further object of the present invention to provide a highly granulated silicon layer having an increased surface area relative to the surface area of the silicon layer as presently produced.

It is a further object of the present invention to provide a process of making a highly granulated silicon layer having an increased surface area relative to the existing methods of making a silicon layer and its associated surface area.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the Summary of the Invention and the Detailed Description, below, which describe the preferred embodiment in addition to the scope of the invention defined by the claims considered in conjunction with the accompanying drawings.

SUMMARY OF THE INVENTION

A silicon layer having an increased surface area in a highly granulated form, and a method for manufacturing such a layer of the present invention is defined by the claims with a specific embodiment shown in the attached drawings. For the purpose of summarizing the invention, the invention relates to a process for manufacturing a highly granulated silicon layer on a substrate, that is, a unit semiconductor element, e.g. a MOSFET, which is partially completed on a silicon substrate or a silicon substrate, and which comprises sequentially depositing a first insulating layer, a first silicon layer and a second insulating layer on the silicon substrate. A second silicon layer is deposited on the second insulating layer which simultaneous unevenly etches away the second insulating layer forming a plurality of pin holes through the second insulating layer to expose the first silicon layer thereunder at each pin hole. The first silicon layer and the second silicon layer are preferably selected from a group consisting of poly silicon and amorphous silicon. The second silicon layer is etched to expose the second insulating layer and the first silicon layer exposed at each pin hole of the plurality of pin holes formed in the second insulating layer. The first silicon layer exposed by the plurality of pin holes formed in the second insulating layer is etched to form a plurality of cavities into the first silicon layer. The second insulating layer is etched to removed it and simultaneously deepen each cavity of the plurality of cavities to form a highly granulated silicon layer having an effectively increased surface area. The second insulating layer may be removed while simultaneously deepening each cavity of said plurality of cavities by successively performing an over-etching process. Thereafter the resulting structure is wet-etched by dipping into HF solution to that the second insulating layer is completely removed.

Preferably, an additional silicon layer, hereafter referred to as a third silicon layer, is deposited to a predetermined thickness on the entire surface of the first silicon layer to repair any damage that may have occurred to the surface of the first silicon layer caused by removing the second insulating layer thereby forming a damage protected and highly granulated silicon layer resulting in an effectively increased surface area. The third silicon layer is preferably selected from the group consisting of polysilicon and amorphous silicon.

The second insulating layer formed on the first silicon layer may be formed with an oxide layer by forming the oxide layer to a thickness of 5–30 Angstroms on the first silicon layer utilizing a solution of $H_2SO_4$ and $H_2O_2$. Also, the second insulating layer formed on the first silicon layer may be formed with an oxide layer by forming the oxide layer to a thickness of 100–500 Angstroms on the first silicon layer at a temperature of 800–900 degrees Celsius in the presence of oxygen. The resulting oxide layer is then dry-etched, i.e. anisotropically etched, to a thickness of 50–200 Angstroms.

The second insulating layer deposited on the first silicon layer may be ion-implanted to enhance the cohesion of the second insulating layer to the first silicon layer.

The plurality of cavities is formed by dry-etching the second silicon layer, any remaining layer of the second insulating layer and the first silicon layer exposed by the plurality of pin holes, such that the ratio of the etching selectivity of the first and second silicon layer to the remaining 3A second insulating layer is over 5:1. The dry-etching process preferably takes place in the presence of a gas selected from the group consisting of $Cl_2$ and $SF_6$.

Preferably, each cavity of the plurality of cavities is deepened by wet-etching until the second insulating layer is completely removed.

The second embodiment of the present invention is a process for manufacturing a highly granulated silicon layer, on a silicon substrate comprising sequentially depositing a first insulating layer, such as an oxide or a nitride, and a first silicon layer, such as a polysilicon and an amorphous silicon, on the surface of the silicon substrate. Preferably, the thickness of the first silicon layer is from several hundred to several thousand Angstroms. A second insulating layer is deposited on the first silicon layer. The second insulating layer is preferably formed of an oxide having a thickness of 100-500 Angstroms. The second insulating layer is etched in a manner to unevenly erode the second insulating layer such that the thickness of the second insulating layer varies and a plurality of pin holes is formed in the second insulating layer with each hole exposing a portion of the first silicon layer. The second insulating layer is preferably etched by dry-etching or by sputter-etching. The first silicon layer exposed by the plurality of pin holes in the second insulating layer is etched to form a plurality of cavities in the first silicon layer and to further etch the unevenly eroded second insulating layer. The first silicon layer and the second insulating layer are selectively etched to deepen each cavity of the plurality of cavities and to remove the second insulating layer. The plurality of cavities formed in first silicon layer is successively etched to deepen each cavity and to remove the second insulating layer to form a highly granulated silicon layer having increased surface area.

Preferably, selective etching is performed by anisotropic etching utilizing a gas selected from the group consisting of $Cl_2$ or $SF_6$ such that the ratio of the etching selectivity of the first silicon layer to the remaining second insulating layer is over 5:1. After successively etching the plurality of cavities a wet-etching process is performed by dipping the resulting structure into HF solution in order to ensure that the second insulating layer is completely removed. After the wet-etching process an additional silicon layer, hereafter referred to as a third silicon layer 16, is preferably deposited to a predetermined thickness on the entire surface of the first silicon layer to repair any damage that may have occurred to the surface of the first silicon layer caused by removing the second insulating layer thereby forming a damage protected and highly granulated silicon layer resulting in an effectively increased surface area.

The present invention further includes the highly granulated silicon layer produced by the present process.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts throughout the several views of the drawings.

DETAILED DESCRIPTION OF THE INVENTION

Figure 1:
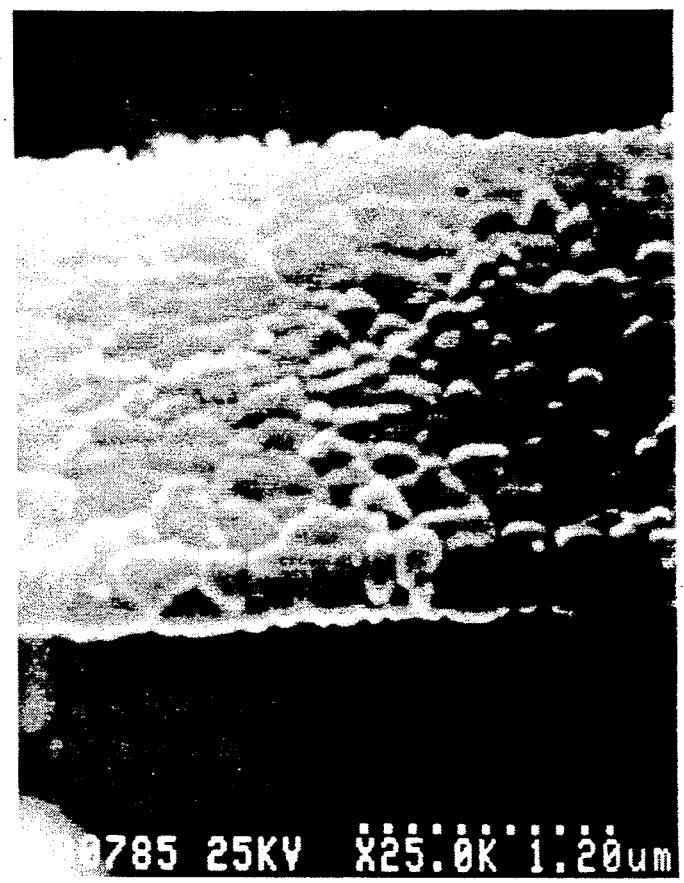
FIG. 1 is an enlarged photograph illustrating the surface state of the silicon layer as presently produced.

FIG. 1 shows a SEM (Scanning Electron Microscope with a magnification ratio of 25,000:1) photograph of the surface of the silicon layer for a charge storage electrode prepared according to a prior art process, i.e. without any of the process steps subsequent to depositing the silicon layer being directed to increasing the effective surface area of this layer.

Figure 2:
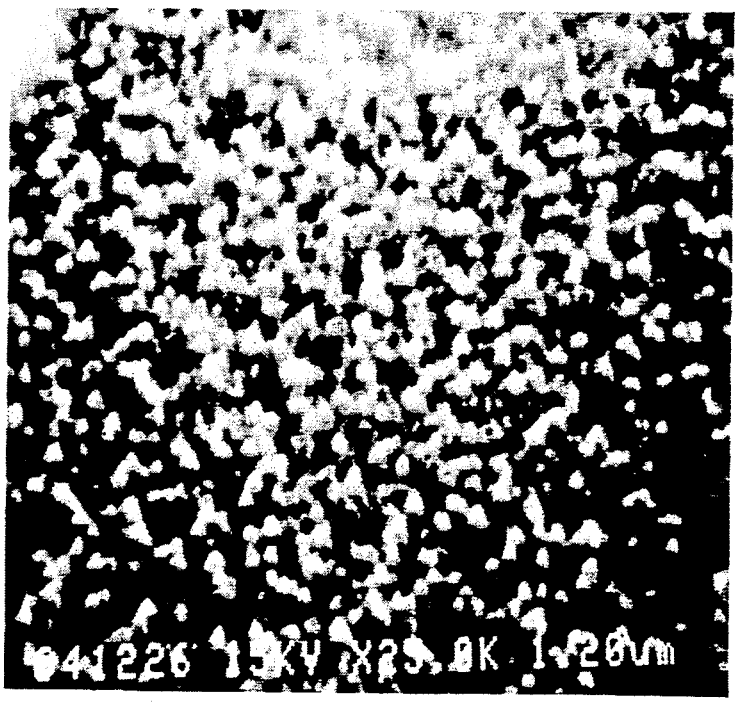
FIG. 2 is an enlarged photograph illustrating the surface state of the silicon layer according to the present invention.

FIG. 2 shows a SEM (Scanning Electron Microscope with a magnification ratio of 25,000:1) photograph of the surface of the silicon layer for charge storage electrode, absent the third silicon layer 7,16 (described below) according to the present invention.

On comparing the photographs, it can be readily appreciated that the surface of the silicon layer of FIG. 2 is more granulated than the surface of the prior art silicon layer of FIG. 1. Thus, the silicon layer of the present invention has a greater surface area relative to the silicon layer of the prior art.

FIGS. 3A through 3E present process steps for manufacturing a silicon layer according to the first embodiment of the invention.

Figure 3A:
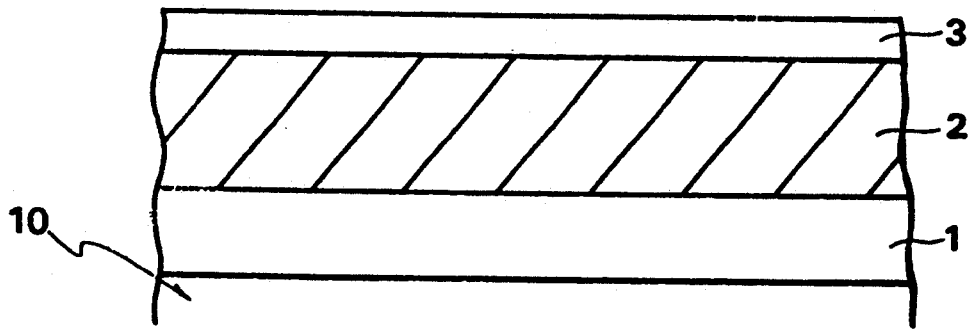
FIGS. 3A through 3E are process steps for forming a silicon layer according to the first embodiment of the present invention.

Referring to FIG. 3A, it is assumed that either a silicon substrate 10 is formed or a unit semiconductor element, for example a MOSFET etc., (not shown) which is partially completed is formed on the silicon substrate 10 upon which the silicon layer according to the present invention will be deposited. A first insulating layer 1, for example, an oxide layer or a nitride layer, is formed on the resulting structure of the silicon substrate 10. A first silicon layer 2, for example, a poly silicon layer or an amorphous silicon layer, is then deposited to a predetermined thickness of several hundred to several thousand Angstroms on the entire surface of the first insulating layer 1. A second insulating layer 3, for example, an oxide layer or a nitride layer, is deposited to a predetermined thickness on the entire first silicon layer 2.

Two methods are described for forming the second insulating layer 3 as an oxide layer. One method is to form an oxide layer by developing it to a thickness of 5-30 Angstroms for about 10 minutes in the mixture solution of $H_2SO_4$ and $H_2O_2$. The second method is to form an oxide layer by developing it to a thickness of 100-500 Angstroms at a temperature of 800-900 degrees Celsius in a furnace, with the simultaneous application of Oxygen gas, which is the conditional gas, and by either dry-etching or sputter-etching the resulting oxide layer to the extent of a thickness of, approximately, 50-200 Angstroms, utilizing a gas such as either $CHF_3$ or $CF_4$ gas.

After the second insulating layer 3 has been deposited, an ion-implanting process is performed on the second insulating layer 3 to promote the formation of the pin holes through the second insulating layer during the deposition of the second silicon layer 5. It is believed that the ion-implant process increases the cohesion of the oxide layer 3 resulting in a more dense layer which is more easily eroded during the deposition of the second silicon layer 5. and which is more easily etched during the following etching process (FIGS. 4A and 4B) However, other explanations are possible and the inventor does not consider that this explanation is the only explanation.

Figure 3B:
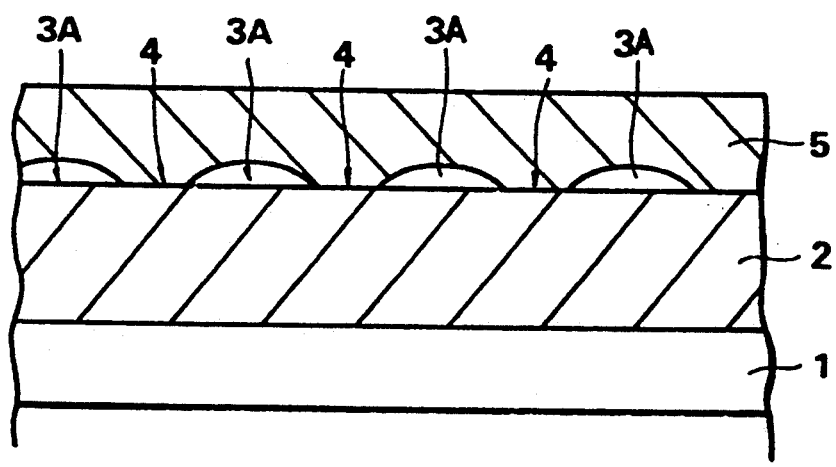

FIG. 3B illustrates a cross section in which a second silicon layer 5, for example, a poly silicon layer or an amorphous silicon layer, is deposited on the second insulating layer 3. Here, when the second silicon layer 5 is deposited on the second insulating layer 3, the second insulating layer 3 is also unevenly etched to thereby form a plurality of pin holes 4 therein, due to the relative thinness of the second insulating layers 3. Thus, portions of the second insulating layer 3 remain on the first silicon layer 2 (a first remaining layer 3A) thereby exposing portions of the first silicon layer 2 as shown in the drawing. The second silicon layers 5 will contact the exposed first silicon layer 2 through the plurality of pin holes 4 as illustrated at FIG. 3B.

Figure 3C:
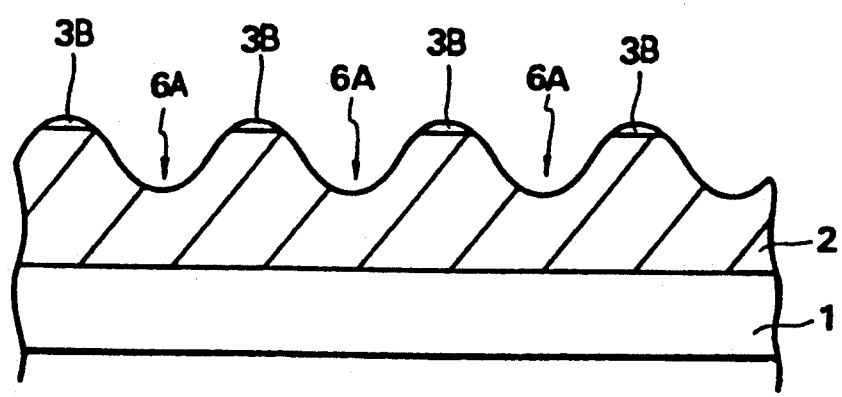

Referring to FIG. 3C, the second silicon layer 5, the remaining second insulating layer 3 (first remaining layer 3A) and the first silicon layer 2 are sequentially etched to completely remove the second silicon layer 5, to etch into the first silicon layer 2 and to only minimally etch the remaining 3A second insulating layer 3. This result is due to the etching selectivity of the first and second silicon layer 2, 5 which have a ratio greater than the etching selectivity of the first remaining layer 3A of the second insulating layer 3. In this embodiment, anisotropic etching having the etching selectivity as mentioned above is performed utilizing a gas, such as $Cl_2$ or $SF_6$, under conditions where the ratio of the etching selectivity of the first and second silicon layer 2, 5 to the second insulating layer 3 (first remaining layer 3A) is over 5:1.

Each of the pin holes of the plurality of pin holes is then successively etched to form a plurality of cavities 6A into the first silicon layer 2. During the formation of the cavities minimal etching of the remaining 3A second insulating layer 3 takes place to result in a second remaining layer 3B of the second insulating layer 3.

Figure 3D:
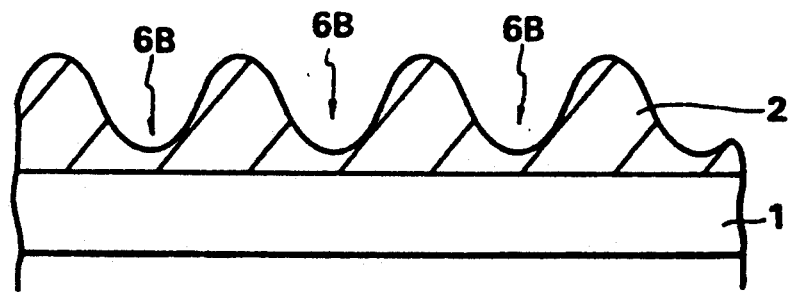

FIG. 3D illustrates a sectional view in which the second remaining layer 3B of the second insulating layer 3 shown in FIG. 3C is completely removed by successively performing an over-etching process, and each cavity 6A of the plurality of cavities is further etched into the first silicon layer 2 to deepen each cavity 6B of the plurality of cavities.

Figure 3E:
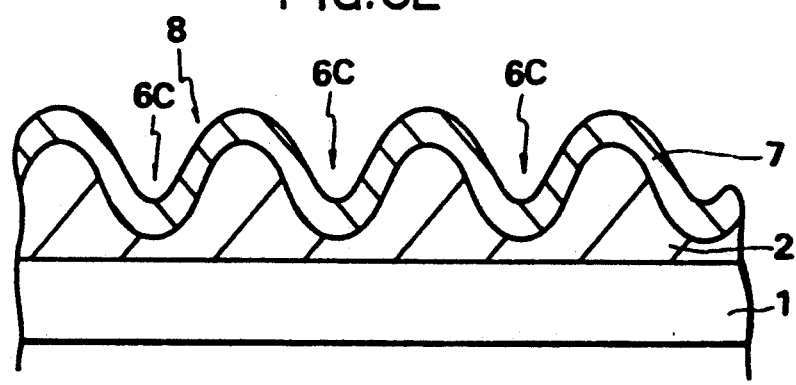

Referring to FIG. 3E, in order to completely remove any of the second remaining layer 3B of the second insulating layer 3 present after the etching process, FIG. 3D, wet-etching is performed by dipping the resulting structure as illustrated in FIG. 3D into HF solution. During this process, the surface of the first silicon layer 2 can be undesirably damaged. In order to repair or guard against this problem, a third silicon layer 7 is deposited to a predetermined thickness on the entire surface of the resulting structure as shown in FIG. 3E. As described above, a silicon layer having increased surface area 8 can be obtained by granulating the surface according to the invention.

FIGS. 4A through 4E illustrate process steps for manufacturing a silicon layer according to the second embodiment of the invention. In this embodiment, the extended surface area of the silicon layer is granulated, by directly forming a plurality of holes 14B into the first silicon layer 12 without the step forming the second silicon layer 5 of FIG. 3B.

Figure 4A:
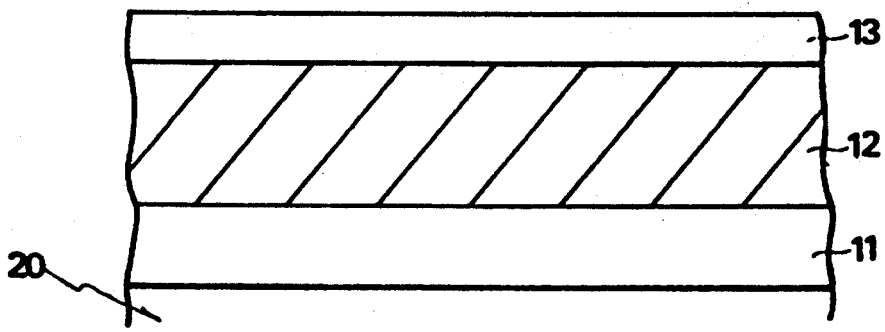
FIGS. 4A through 4E are process steps for forming a silicon layer according to the second embodiment of the present invention.

Referring to FIG. 4A, it is assumed that a silicon substrate 20 is formed or a unit semiconductor element (not shown) which is partially completed is formed on the silicon substrate 20. A first insulating layer 11, for example, an oxide layer or a nitride layer, is formed on the resulting structure of the silicon substrate 20. A first silicon layer 12, for example, a poly silicon layer or amorphous silicon layer, is then deposited to a predetermined thickness of several hundred to several thousand Angstroms on the entire surface of the first insulating layer 11. A second insulating layer 13 is then deposited, for example, an oxide layer or a nitride layer, on the first silicon layer 12. If an oxide layer is used as the second insulating layer 13, the thickness of the oxide layer of 100-500 Angstroms is desirable. Here, the method for forming the second insulating layer 13 with the oxide layer on the first silicon layer 12 and the method of ion-implantation are the same methods which were fully described in connection with FIG. 3A. Hence, the description hereat will be abbreviated in order to avoid any unnecessary repetition.

Figure 4B:
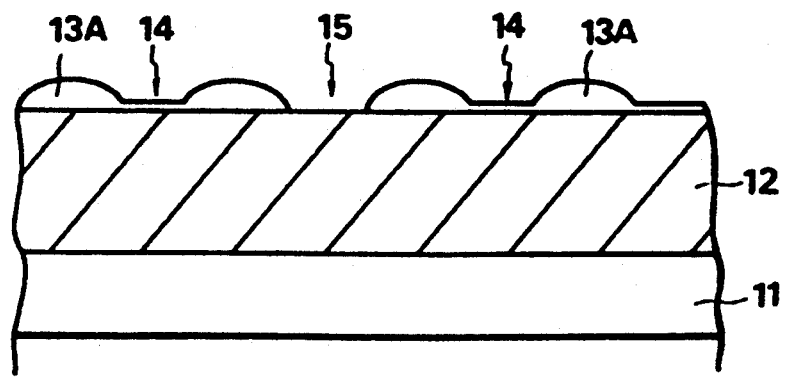

FIG. 4B illustrates the second insulating layer 13 (first remaining layer 13A) unevenly formed on the first silicon layer 12 as a result of dry-etching the second insulating layer 13 of FIG. 4A. The second insulating layer 13 may also be sputter-etched to attain the layer as illustrated in FIG. 4B. Dry-etching or sputter-etching results in the second insulating layer 13 so etched to have an uneven thickness, so that a plurality of first holes 14 is formed into the thickness of the second insulating layer 13. And when the second insulating layer 13 which has been unevenly etched, is etched again, each hole of the plurality of first holes 14 is additionally etched, so that a plurality of pin holes 15 is formed to expose a portion of the first silicon layer 12 through the first remaining layer 13A of the second insulating layer 13.

Figure 4C:
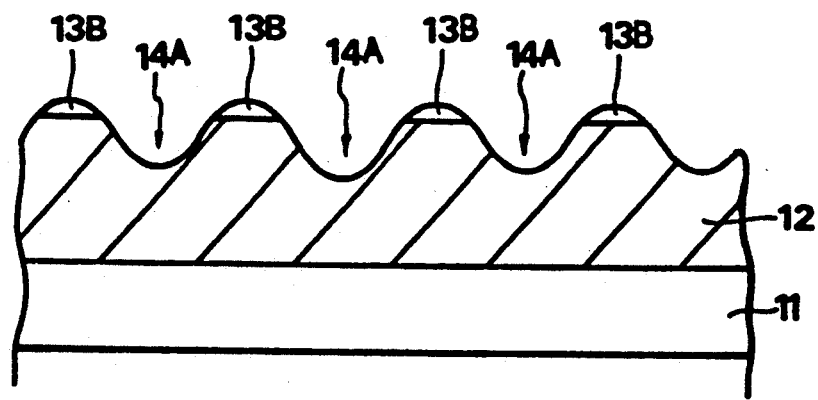

The exposed first silicon layer 12 and the first remaining layer 13A of the second insulating layer 13, FIG. 4B, are sequentially etched to form a plurality of cavities 14A into the first silicon layer 12 and to further etch the remaining 13A second insulating layer 13 to a second remaining layer 13B, as illustrated at FIG. 4C. In this etching step, the etching selectivity of the first silicon layer 12 has a ratio greater than that of the first remaining layer 13A of the second insulating layer 13. In this embodiment, anisotropic etching having the etching selectivity as mentioned above is performed utilizing a gas selected from either $Cl_2$ or $SF_6$, under the condition that the ratio of the etching selectivity of the first silicon layer 12 to the remaining layer 13A of the second insulating layer 13 is over 5:1. As a result, the exposed first silicon layer 12 and the first remaining layer 13A of the second insulating layer 13 are etched as described above to form each cavity 14A of the plurality of cavities into the first silicon layer 12 and to further etch the remaining layer 13A of the second insulating layer 13 to the remaining layer 13B, as shown in FIG. 4C. It is noted that since the etching rate of the first silicon layer 12 is faster than that of the first remaining layer 13A of the second insulating layer 13, the plurality of cavities are formed both at the plurality of pin holes 15, where the first silicon layer 12 is exposed, and at those portions of the first silicon layer 12 which are beneath each first hole of the plurality of the first holes 14 where the first remaining layer 13A of the second insulating layer 13 is very thin.

Figure 4D:
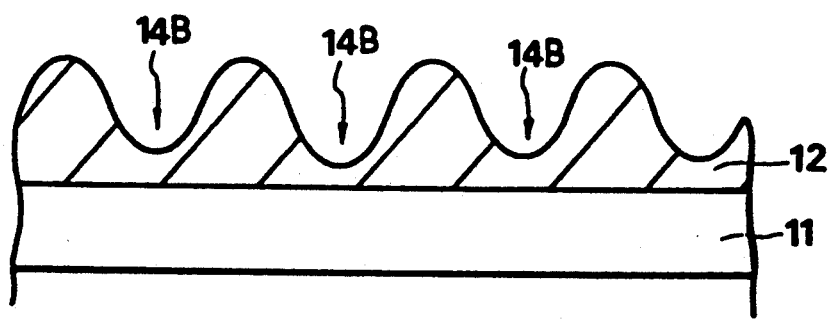

Referring to FIG. 4D, each cavity 14A of the plurality of cavities is deepened to result in a cavity 14B by successive etching of the exposed first silicon layer 12 into which the plurality of the cavities 14A are formed, until the remaining layer 13B of the second insulating 13 is completely etched away. The extent of the depth of each cavity 14B of the plurality of cavities is determined depending upon both the irregularity of the thickness of the first remaining layer 13A of the second insulating layer 13 as shown in FIG. 4B and the etching selectivity of the first silicon layer 12 and the first remaining layer 13A of the second insulating layer 13.

Figure 4E:
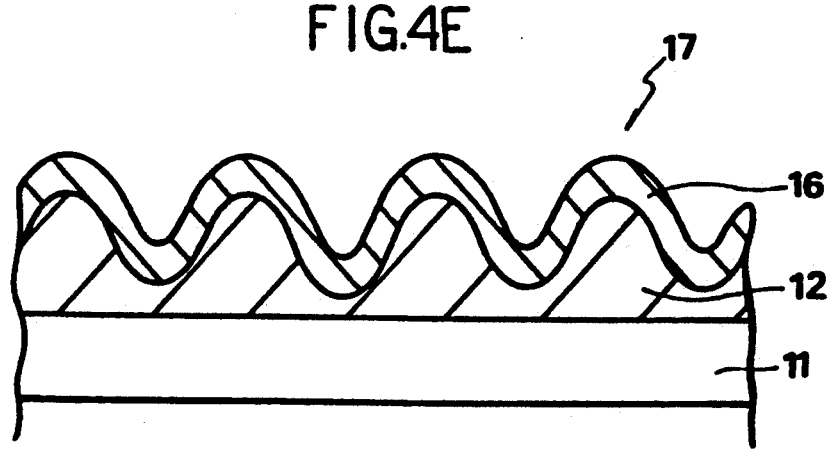

Referring to FIG. 4E, in order to completely remove the second remaining layer 13B of the second insulating layer 13, in the event some remains after the etching process, wet-etching is performed by dipping the resulting structure, as shown in FIG. 4D, into HF solution. During this step since there is a difference in etching selectivity between the first silicon layer 12 and the first remaining layer 13A of the second insulating layer 13, the surface of the first silicon layer 2 may be undesirably damaged by the wet-etching process. In order to recover or guard against the problem of a damaged surface, a second silicon layer 16 is deposited to a predetermined thickness on the entire surface of the resulting structure as shown in FIG. 4E. As described above, a silicon layer having increased surface area 17 can be obtained by granulating the surface according to the process of the invention.

The use of the silicon layer obtained by the first and second embodiments of the invention in a charged storage electrode for stacked capacitor of the semiconductor device increases the capacitance of the stacked capacitor by increasing the effective surface area of the silicon layer for charge storage electrode within the same surface area.

The resulting silicon layer with the highly granulated surface for use in a semiconductor device as illustrated at FIGS. 3D and 4D comprises a first insulating layer 2, 11 formed on the device for electrical insulation of the highly granulated surface silicon layer. The first silicon layer formed on the first insulating layer 2, 11 includes a plurality of deepened cavities 6B,14B formed in the first silicon layer. The resulting increased granulation of the silicon surface forms the highly granulated surfaced silicon layer with an increased surface area. To form a damage protected and highly granulated surfaced silicon layer with an increased surface area, a third silicon layer 7, 16 is formed on the first silicon layer as illustrated at FIGS. 3E and 4E. FIG. 1 is the actual electron microscope illustration according to the present invention, absent the third silicon layer 7, 16 which distinguishes the surface topography of the present invention from that of the prior art surface topography as shown in FIG. 2.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A silicon layer having a highly granulated surface for use in a semiconductor device, said silicon layer comprising:
   a first insulating layer formed on a substrate for electrical insulation; and
   a first silicon layer formed on said first insulating layer and having a highly granulated surface prepared by depositing a second insulating layer on the substrate, performing an ion-implanting process on the second insulating layer, depositing a second silicon layer on the second insulating layer which simultaneously unevenly etches away the second insulating layer to form a plurality of pin holes in the second insulating layer exposing the first silicon layer thereunder at each pin hole, etching the second silicon layer to expose the second insulating layer and the first silicon layer exposed at each pin hole of the plurality of pin holes formed in the second insulating layer, etching the first silicon layer exposed by the plurality of pin holes in the second insulating layer to form a plurality of cavities in the first silicon layer, and removing the second insulating layer while simultaneously deepening each cavity of the plurality of cavities.

2. The silicon layer of claim 1 which further includes an additional silicon layer formed on said first silicon layer to provide a damage protected and highly granulated surfaced silicon layer with an increased surface area.

3. A silicon layer having a highly granulated surface for use in a semiconductor device, said silicon layer prepared by a process comprising the steps of:
   sequentially depositing a first insulating layer, a first silicon layer and a second insulating layer on the substrate;
   performing an ion-implanting process on the second insulating layer;
   depositing a second silicon layer on the second insulating layer which simultaneously unevenly etches away the second insulating layer formed a plurality of pin holes in the second insulating layer to expose the first silicon layer thereunder at each pin hole;
   etching the second silicon layer to expose the second insulating layer and the first silicon layer exposed at each pin hole of the plurality of pin holes formed in the second insulating layer;
   etching the first silicon layer exposed by the plurality of pin holes in the second insulating layer to form a plurality of cavities in the first silicon layer; and
   removing the second insulating layer while simultaneously deepening each cavity of the plurality of cavities.

* * * * *